United States Patent [19]

Valster et al.

[11] Patent Number: 5,703,894
[45] Date of Patent: Dec. 30, 1997

[54] RADIATION-EMITTING SEMICONDUCTOR DIODE AND METHOD OF MANUFACTURING SUCH A DIODE

[75] Inventors: Adriaan Valster; Johannes A. De Poorter; Gerard A. Acket, all of Eindhoven, Netherlands

[73] Assignee: U.S. Philips Corporation, New York, N.Y.

[21] Appl. No.: 538,267

[22] Filed: Oct. 3, 1995

[30] Foreign Application Priority Data

Oct. 6, 1994 [EP] European Pat. Off. .............. 94202895

[51] Int. Cl.⁶ ...................................................... H02S 3/19
[52] U.S. Cl. ............................................... 372/46; 372/45
[58] Field of Search .................................... 372/45, 46

[56] References Cited

U.S. PATENT DOCUMENTS

| 4,378,255 | 3/1983 | Holonyak, Jr. et al. | 372/45 |
|---|---|---|---|
| 4,671,830 | 6/1987 | Burnham | 148/186 |
| 5,138,626 | 8/1992 | Yap | 372/46 |
| 5,153,890 | 10/1992 | Bona et al. | 372/48 |
| 5,296,717 | 3/1994 | Valster et al. | 257/13 |
| 5,574,741 | 11/1996 | Arimoto | 372/45 |
| 5,577,063 | 11/1996 | Nagai et al. | 372/46 |

OTHER PUBLICATIONS

"New Window–Structure InGaAlP Visible Light Laser Diodes by Self–Selective Zn Diffusion–Induced Disordering" by K. Itaya et al., published IEEE Journal of Quantum Electronics, vol.27, No.6, Jun. 1991, pp.1496–1500.

Primary Examiner—James W. Davie
Attorney, Agent, or Firm—Brian J. Wieghaus

[57] ABSTRACT

The invention relates to a radiation-emitting semiconductor diode, in particular a laser diode, whose active layer (3) comprises a II–V mixed crystal in which various elements, for example III elements, may be present in orderly or disorderly arrangement. Such a mixed crystal is InGaP whose emission lies below 1 μm. In the known diode, catastrophic optical degradation is suppressed in that the active layer (3) has an orderly distribution in the active region (3A) and a disorderly distribution of the elements in a passive region (3B) situated near an exit surface (51). The known diode has a low efficiency and a high starting current. In a diode according to the invention, the distribution of the different elements is disorderly in the active region (3A), while the passive region (3B) is formed through local intermixing of the active layer (3). Such a diode surprisingly has a high efficiency and a low starting current, shows very little propensity to said degradation, and is in addition very easy to manufacture. The invention accordingly also relates to a method of manufacturing such a diode. Said disorderly distribution is realised, for example, through a high growing temperature, while said intermixing is achieved through local diffusion of, for example, Zn or Si. Intermixing may take place during or after the manufacture of the semiconductor layers.

9 Claims, 3 Drawing Sheets

RADIATION-EMITTING SEMICONDUCTOR DIODE AND METHOD OF MANUFACTURING SUCH A DIODE

BACKGROUND OF THE INVENTION

The invention relates to a radiation-emitting semiconductor diode comprising a semiconductor body with a semiconductor substrate of a first conductivity type on which are present at least in that order a first cladding layer of the fast conductivity type, an active layer, and a second cladding layer of a second conductivity type opposed to the first, which cladding layers are provided with means for supplying current, while the active layer comprises a mixed crystal of III–V semiconductor materials in which atoms of different elements may be present in an orderly or disorderly arrangement on a sub-lattice and a strip-shaped active region which is separated by a passive region from an exit surface for radiation generated in the diode. The invention also relates to a method of manufacturing such a diode.

Such radiation-emitting diodes are often used as radiation sources in the form of LEDs (=Light Emitting Diodes), but also in the form of lasers. Applications are glass fibre communication systems in which the radiation wavelength is above 1 µm, or information processing systems such as laser printers, optical disc systems such as CD(V) (=Compact Disc (Video)) players, or bar code readers in which the radiation wavelength is below 1 µm. In the former case the III–V material system is InP/InGaAsP, in the latter case GaAs/InGaAlP. The III elements in both III–V material systems may be distributed over the sub-lattice in an orderly or disorderly manner. This is in contrast to a material system such as GaAs/AlGaAs in which the III elements can be distributed in one manner only.

Such a radiation-emitting diode and method of manufacturing it are known from the article "New Window-Structure InGaAlP Visible Light Laser Diodes by Self-Selective Zn Diffusion-Induced Disordering" by K. Itaya et al., published in IEEE Journal of Quantum Electronics, vol. 27, no. 6, June 1991, pp. 1496–1500. This relates to a diode laser with an InGaP active layer, cladding layers comprising InAlGaP, and a passive region also comprising InGaP between the active region and a laser mirror. The diode emits in the visible range of the spectrum. Atoms of the various elements are present in said mixed crystals of III–V materials on a sub-lattice, in this case In and Ga atoms on the III element sub-lattice as far as the active layer is concerned. These atoms may be distributed over the sub-lattice in an orderly or disorderly manner. Given a same material composition, a disorderly distribution results in a higher bandgap than an orderly distribution. In the known laser, the In and Ga atoms in the active layer have been given an orderly distribution within the active region and a disorderly distribution adjacent the mirror. Thus a passive region is formed adjacent the mirror. Such a passive region strongly contributes to the suppression of so-called COD (=Catastrophic Optical Damage) degradation.

A disadvantage of the known semiconductor diode is that its efficiency is comparatively low and—in the case of a laser—its starting current is comparatively high.

SUMMARY OF THE INVENTION

The invention had for its object to provide a diode which does not have said disadvantage, so a diode having on the one hand a passive mirror region with an excellent COD suppression and on the other hand the highest possible efficiency and the lowest possible starting current, while it is in addition easy to manufacture.

According to the invention, a radiation-emitting semiconductor diode of the kind described in the opening paragraph is for this purpose characterized in that the distribution of the atoms of different elements over the sub-lattice in the active region is disorderly, and the passive region is formed through intermixing of the active layer. It was surprisingly found that an active layer with an orderly distribution has greater losses than an active layer with a more disorderly distribution. An active region with a more disorderly distribution accordingly results not only in a shorter wavelength of the generated radiation but also in a greater efficiency and a lower starting current. The invention is further based on the surprising recognition that, also in the case of an active region having a disorderly distribution, nevertheless a passive region with a greater disorderliness and a greater bandgap can be formed, and that this can be done moreover in a comparatively simple manner, i.e. through intermixing of the active layer. This intermixing may be done in two ways: first by means of mixing of (part of) the active layer with (pan of) a (separate) confinement layer. The latter comprises semiconductor material of much higher bandgap than the active layer, and intermixing accordingly results in an intermediate bandgap. It is also possible to intermix the active layer with a layer of semiconductor material of higher bandgap situated within the active layer. Intermixing may be obtained, for example, through diffusion of a suitable impurity in a suitable concentration through the active layer and (part of) a (separate) confinement layer, or exclusively through the active layer. A diode according to the invention thus has the highest possible efficiency and the lowest possible starting current as well as a passive region with which the COD is strongly suppressed, while the diode is nevertheless very easy to manufacture. An additional advantage is that a much wider choice is available as to the difference in bandgap between the active and passive regions because the difference in bandgap between materials having an orderly and materials having a disorderly distribution is of the order of 75 meV, whereas the difference between a disorderly and an intermixed active layer may easily amount to, for example, 150 meV.

In a preferred embodiment, the active layer comprises at least one quantum well layer, preferably a multiple quantum well layer. Intermixing is achieved most easily when the active layer is comparatively thin, i.e. comprises a quantum well. The use of a multiple quantum well layer has the advantage that a barrier layer, which is also thin, can be used for intermixing of the active layer. Thicknesses and compositions of the active layer and (separate) confinement layers together with the conditions during intermixing determine the bandgap value of the passive region, and thus the difference in bandgap between the active and passive regions.

Preferably, a radiation-emitting semiconductor diode according to the invention comprises an active layer of InGaP or InAlGaP and is constructed as a laser. As noted above, not only InCaAsP but also (Al)InGaP is a material in which an orderly as well as a disorderly distribution can be present. The material supplies radiation in the visible range (630 to 690 nm) and a diode manufactured from this material, in particular in a laser version, is highly suitable for many of the applications mentioned above.

A favourable modification further comprises an active layer which is under compression stress. The wavelength of the generated radiation may be shifted back thereby in the direction of the wavelength of a diode having an orderly active layer, such as the known diode. An active layer under stress also results in an even lower starting current.

A method of manufacturing a radiation-emitting diode whereby consecutively at least a first cladding layer of a first conductivity type, an active layer, and a second cladding layer of a second conductivity type opposed to the first are provided on a semiconductor substrate of the first conductivity type, which cladding layers are provided with means for supplying a current while a mixed crystal of III–V semiconductor materials is chosen for the active layer in which atoms of different elements may be present on a sub-lattice in orderly or disorderly arrangement, and in the active layer a strip-shaped active region is formed which is separated by a passive region from an exit surface to be formed for radiation generated in the diode, is characterized according to the invention in that the atoms of the different elements in the active layer are distributed over the sub-lattice in disorderly manner and the passive region is formed through local intermixing of the active layer. A diode according to the invention is obtained thereby in a simple manner.

In a preferred embodiment of a method according to the invention, the disorderly distribution of the atoms of the different elements in the active layer is achieved through a suitable choice of the growing conditions during provision of the active layer or of the orientation of the substrate, and intermixing of the active layer is carried out through diffusion of impurities into the active layer such a suitable growing condition is, for example, a comparatively high growing temperature of, for example 750° to 760° C. An orientation of the substrate suitable for the purpose is a misorientation relative to the (001) orientation of at least approximately 6 degrees. A orientation other than the (001) orientation is also suitable, such as a (511) or (311) orientation. A local diffusion of, for example, Zn or Si may be used for local intermixing of the active layer. Such a method does not comprise more steps than the known method and is accordingly particularly attractive.

In a first attractive modification thereof, the impurities for intermixing with the active layer are offered from a strip-shaped region above the active layer at the area of the exit surface to be formed. The passive regions may be formed in this manner while all individual diodes are still interconnected, which renders the manufacture relatively simple. Preferably, the impurities are not provided to such a depth that they reach the substrate. Any parasitic currents caused by the impurities are limited as much as possible thereby. Good results are obtained when Zn atoms are chosen for the impurities which are introduced into the diode through a GaAs-containing layer, on which layer a mask is locally present, while the impurities are provided at a temperature of between approximately 550° and 650° C., preferably between approximately 600° and 650° C. This method is comparatively simple and readily applicable in existing technology. The temperature required for this modification of the intermixing process is comparatively high.

Very good results are also obtained with an ion implantation of, for example, Zn ions followed by a temperature treatment. The implantation is preferably effected at low energy, for example 25 keV. The heat treatment takes approximately 10–40 min at a temperature of between 650° and 850° C., preferably approximately 750° C. A drop in the emission wavelength, for example from 670 to 640 nm, is observed then near the exit surface of the InGaP/InAlGaP diode. Ion implantation is a comparatively simple, accurate and reproducible process, in particular the penetration depth is very well controllable thereby. In addition, the ion implantation step may readily be inserted in any stage of manufacture, for example, before a further growing step.

In a second, also very attractive modification, the impurities are offered after the exit surface has been formed. Strip-shaped bodies are first formed containing one single row of diodes, for example through cleaving. The two resulting side faces, or cleaving surfaces, form the exit surfaces for each diode to be formed. One, or preferably two passive regions for each diode are subsequently formed from the gas phase (Zn) or through local ion implantation (Zn, Si or Mg) directly through the exit surfaces. Offering of Zn atoms from the gas phase gives good results. It was surprisingly found that, when this introduction takes place at a comparatively low temperature, the Zn does not penetrate layers comprising GaAs. Since n-GaAs is present in, for example, the substrate or the contact layer, it is prevented in this manner that an uninterrupted p-type region arises between the connection conductors on an exit surface, which would result in short-circuits. This modification has the advantage that the manufacture of the diodes has been completed at the moment of intermixing of the active layer, apart from a single cleaving step. It is important that the exit surfaces have already been formed before the formation of the passive region, and the position of the exit surfaces need accordingly not be aligned with the position of the passive regions. This leads to another advantage, i.e. that the passive regions can now be comparatively narrow, for example approximately 5 μm or less instead of at least approximately 10 μm wide, as is required in the preceding modification where the exit surfaces are formed through cleaving through the passive regions already present. The passive regions can also be narrow now because the penetration of the Zn atoms into the semiconductor body is more superficial than in the first modification. The selective penetration into the semiconductor body of the Zn atoms as mentioned above requires a temperature which is not too high. Excellent results were obtained with gas-phase penetration at a temperature lying between approximately 450° and 550° C., preferably between approximately 475° and 525° C. As mentioned above, a (multiple) quantum well layer is preferably chosen for forming the active layer. (Al)InGaP is preferably chosen as a material for the active layer and the cladding layers, and the diode is preferably constructed as a laser.

An ion implantation as described above may be advantageously applied also in this modification. Very small parasitic currents over the exit surface are then possible because of the very small penetration depth of the impurities. The temperature treatment may be limited or even be omitted in this case. The damage caused by the implantation is partly restored during the operation of the diode, i.e. exclusively at the area of the active layer.

BRIEF DESCRIPTION OF THE DRAWINGS

The invention will now be explained in more detail with reference to two embodiments and the accompanying drawing, in which.

Figure 1:
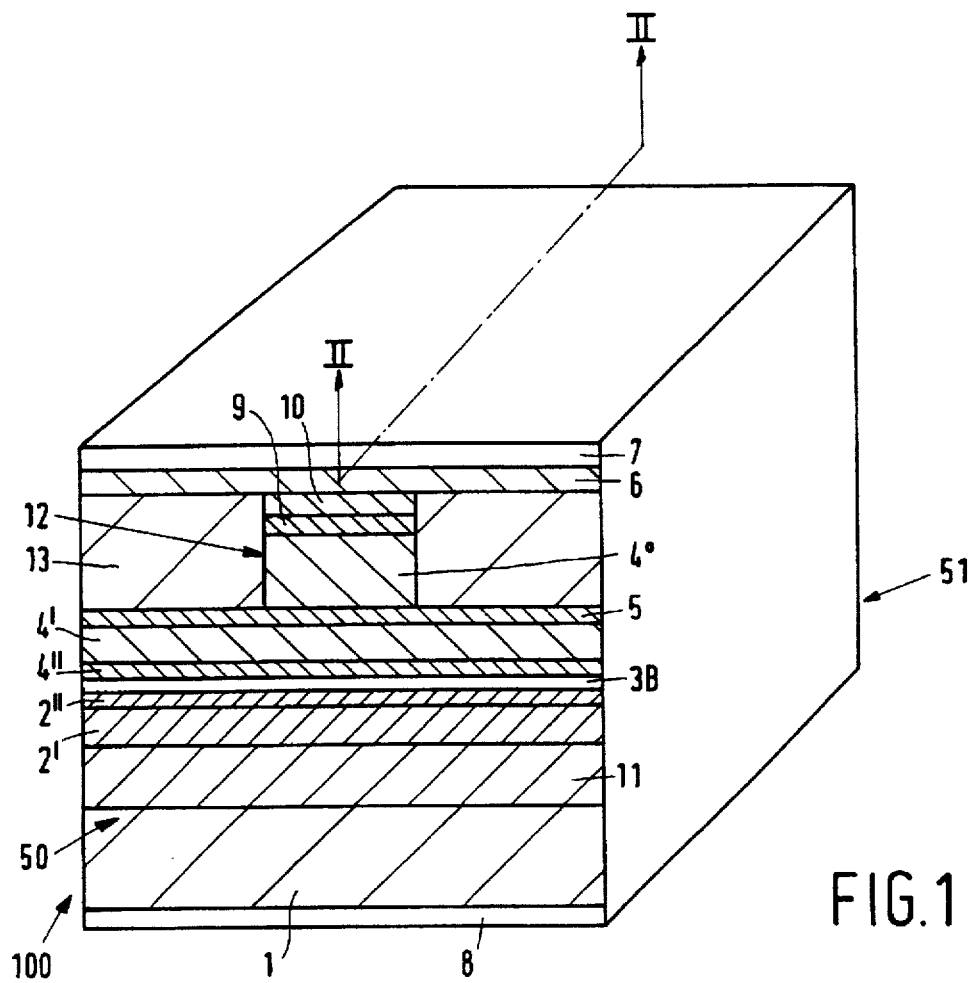
FIG. 1 shows an embodiment of a radiation-emitting semiconductor diode according to the invention in cross-section and partly in perspective view.

The Figures are diagrammatic and not drawn to scale, the dimensions in the thickness direction being particularly exaggerated for greater clarity. Corresponding parts have generally been given the same reference numerals in the various examples. Semiconductor regions of the same conductivity type are generally hatched in the same direction.

DESCRIPTION OF THE PREFERRED EMBODIMENTS

Figure 2:
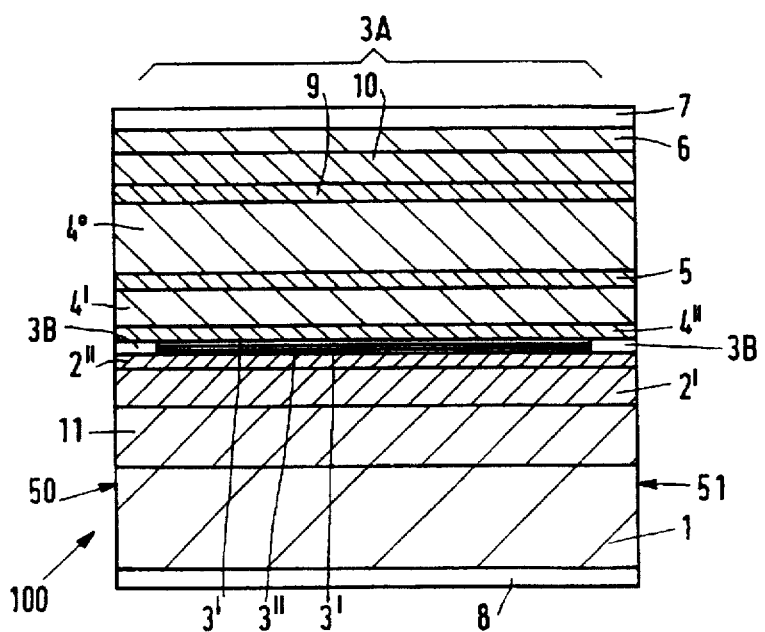
FIG. 2 is a cross-section of the diode of FIG. 1 taken on the line II—II.

FIG. 1 shows a radiation-emitting semiconductor diode according to the invention in cross-section and partly in perspective view. FIG. 2 is a cross-section of the diode of FIG. 1 taken on the line II—II. The diode here comprises a diode laser with a semiconductor body 100 with a substrate 1 of a first, here the n-conductivity type, and consisting of monocrystalline (100) gallium arsenide in this example. A semiconductor layer structure is provided thereon which comprises inter alia a buffer layer 11 of the n-conductivity type, a first cladding layer 2' also of the n-conductivity type, a first separate confinement layer 2", an active layer 3 which here comprises (see e.g. FIG. 2) two quantum well layers 3' separated by a barrier layer 3", a second separate confinement layer 4", and a second cladding layer 4', 4°, here of the p-conductivity type, within which an etching stopper layer 5 is present. Within a mesa-shaped portion 12 of the semiconductor layer structure there is in addition to the portion 4° of the second cladding layer 4', 4° an intermediate layer 9 and a first contact layer 10, both also of the p-conductivity type. An n-type current blocking layer 13 lies on either side of the mesa 12. Over this layer and over the mesa 12 are arranged a second contact layer 6 and a connection conductor 7 for current supply. The substrate 1 is provided with a connection conductor 8 for the same purpose. The active layer 3 comprises a mixed crystal, here InGaP, of III–V semiconductor materials, InP and GaP, in which atoms, in this case In and Ga atoms of different elements can be present, in orderly or disorderly arrangement, on a sub-lattice, here the III element f.c.c. (=face centred cube) sub-lattice. A passive region 3B is present between a strip-shaped active region 3A forming part of the active layer 3 and an exit surface, here two mirror surfaces 50, 51. The pn junction formed between the two cladding layers 2, 4 is capable of generating coherent electromagnetic radiation in the strip-shaped active region 3A of the active layer 3 situated below the mesa 12 and within a resonance cavity formed by the mirror surfaces 50, 51 which are substantially perpendicular to the active region 3A, given a sufficient current strength in the forward direction.

According to the invention, the distribution of the atoms of the different elements, here In and Ga atoms, over the sub-lattice in the active region 3A is disorderly, while the passive region 3B is formed through local intermixing of the active layer 3, here through intermixing between the quantum well layers 3' and the barrier layer 3". Thanks to the disorderly distribution in the active region 3A, the losses in said region are comparatively low, so that the efficiency and starting current of the diode according to the invention are an optimum. The local intermixing of the active layer 3 nevertheless gives rise to a passive region 3B of sufficiently great bandgap. This is based on the surprising effect that layers with a disorderly distribution have the lowest losses, and the surprising recognition that in spite of the choice of disorderliness within the active layer 3, i.e. within the active region 3A, it is still possible to form a passive region 3B with a sufficiently great bandgap. In addition, such a disorderly active region 3A and such a local intermixing of the active layer 3 can be readily realised, i.e. through a suitable choice of the growing conditions of the active layer or of the orientation of the substrate and through the local application of impurities in the active layer 3, respectively.

The (multiple) quantum well layer (3', 3") of the laser in this example renders it easy to achieve said intermixing because very thin layers intermix comparatively easily. An active layer 3 comprising InGaP or AlInGaP, as in the present example, results in visible radiation of comparatively short wavelength, which is highly desirable for many applications. The laser in the present example emits at approximately 680 nm. This value does not differ much from that of a laser having an orderly active layer 3 thanks to the fact that the active layer 3 in the present example has a compression stress. The wavelength corresponding to the bandgap of the passive region 3B is approximately 650 nm. The latter wavelength may be readily reduced to, for example, 610 nm through the choice of a thicker barrier layer 3", or one containing more Al. Such a low wavelength value, however, is less desirable in general because the step in the effective refractive index in transverse direction may become too low in the passive region 3B. By giving the cladding layers 2, 4 a greater bandgap than in the present example, it is possible to bring the optimum bandgap of the passive region 3B to higher values.

The laser in this example is of the index-guided type and has a so-called buried ridge waveguide structure. The thickness, materials, and other properties of the version of the laser described above are given in the Table below.

| No. | Semiconductor | Type | Doping concentr. (at/cm$^3$) | Thickness (μm) |
|---|---|---|---|---|
| 1 | GaAs (substrate) | N | $2 \times 10^{18}$ | 350 |
| 11 | Al$_{0.2}$Ga$_{0.8}$As | N | $2 \times 10^{18}$ | 0,1 |
| 2' | In$_{0.5}$Al$_{0.35}$Ga$_{0.15}$P | N | $2 \times 10^{18}$ | 1,3 |
| 2" | In$_{0.5}$Al$_{0.2}$Ga$_{0.3}$P | — | — | 0,03 |
| 3' | In$_{0.62}$Ga$_{0.38}$P | — | — | 0,0085 |
| 3" | In$_{0.5}$Al$_{0.2}$Ga$_{0.3}$P | — | — | 0,006 |
| 4" | In$_{0.5}$Al$_{0.2}$Ga$_{0.3}$P | — | — | 0,03 |
| 4' | In$_{0.5}$Al$_{0.35}$Ga$_{0.15}$P | P | $4 \times 10^{17}$ | 0,5 |
| 4° | In$_{0.5}$Al$_{0.35}$Ga$_{0.15}$P | P | $4 \times 10^{17}$ | 1,0 |
| 5 | In$_{0.4}$Ga$_{0.6}$P | P | $1 \times 10^{18}$ | 0,01 |
| 6 | GaAs | P | $2 \times 10^{18}$ | 0,5 |
| 9 | In$_{0.5}$Ga$_{0.5}$P | P | $1 \times 10^{18}$ | 0,1 |
| 10 | GaAs | P | $2 \times 10^{18}$ | 0,5 |
| 13 | GaAs | N | $2 \times 10^{18}$ | 1,4 |

The width and length of the mesa-shaped strip 12 are approximately 5 μm and approximately 500 μm, respectively. The thickness of the passive region 3B here is approximately 10 μm. The conductive layer 8 on the substrate 1 in this example is a gold-germanium-nickel layer with a thickness of approximately 100 nm. The conductive layer 7 in this example comprises a platinum, a tantalum, and a gold layer with thicknesses of approximately 100, approximately 50, and approximately 250 nm, respectively.

Figure 3:
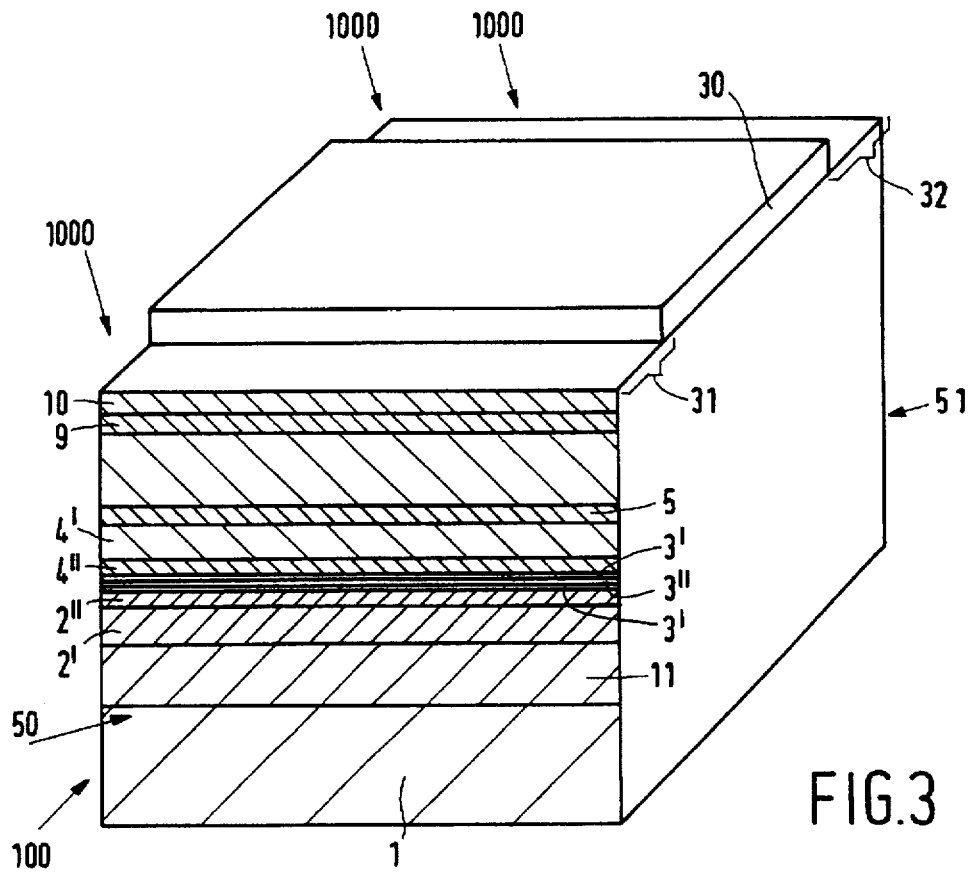
FIGS. 3 to 5 show the radiation-emitting semiconductor diode of FIG. 1 in consecutive stages of manufacture by a first version of a method according to the invention, in cross-section and partly in perspective view.
Figure 4:
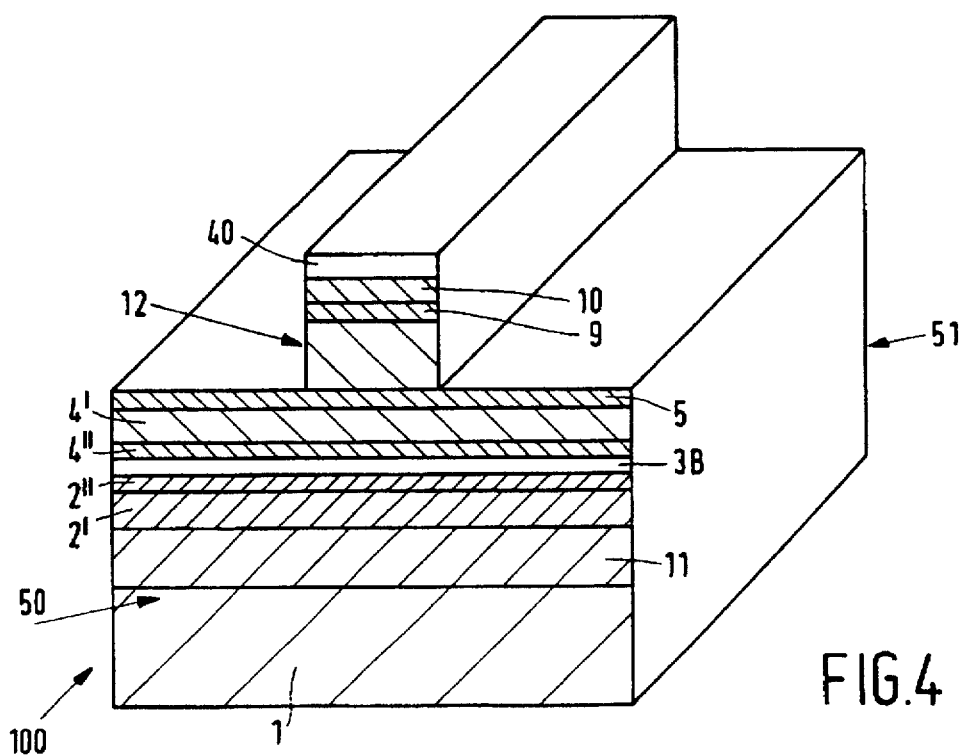
Figure 5:
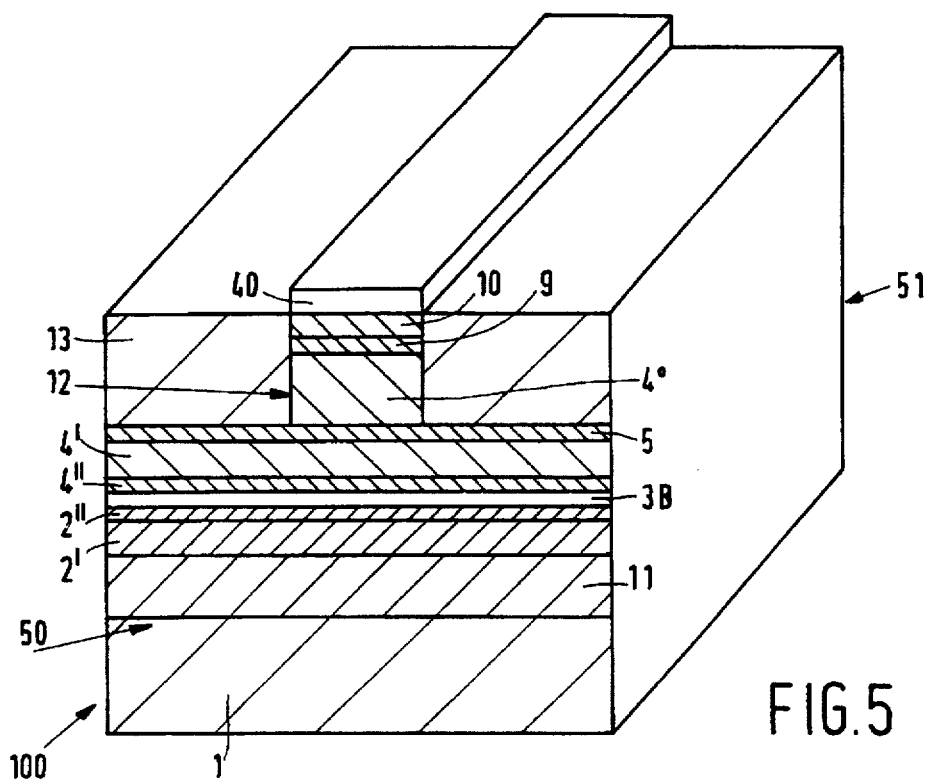

FIGS. 3 to 5 show the radiation-emitting semiconductor diode of FIG. 1 in consecutive stages of its manufacture by a first embodiment of a method according to the invention, in cross-section and partly in perspective view. The method is based on a (100) substrate 1 of monocrystalline n-type gallium arsenide (see FIG. 3) with a doping concentration of $2 \times 10^{18}$ atoms per cm$^3$ and a thickness of, for example, 350 μm. After polishing and etching of the surface having the (001) orientation, the following are grown thereon, for example from the gas phase by means of OMVPE (=Organo Metallic Vapour Phase Epitaxy): a buffer layer 11, a first cladding layer 2', a first separate confinement layer 2", an active layer 3 comprising a first quantum well layer 3', a barrier layer 3", and a second quantum well layer 3', a second separate confinement layer 4", a first portion 4' of a second cladding layer 4', 4°, an etching stopper layer 5, a second portion 4° of the second cladding layer 4', 4°, an intermediate layer 9, and a first contact layer 10. A mixed crystal, here InGaP, is chosen for the active layer 3 in which the In and Ga atoms may be distributed over the III element lattice in an orderly or disorderly manner.

According to the invention, the In and Ga atoms of an active region 3A to be formed in the active layer 3 are distributed disorderly over their sub-lattice in this case. This is done by the present embodiment of the method through a suitable choice of the growing conditions while the active layer 3 is being provided. Such a suitable condition is, for example, a comparatively high growing temperature of approximately 760° C. All semiconductor layers are provided at said temperature in this case. At the same time, in the method according to the invention, a passive region 3B is formed between the active region 3A to be formed and an exit surface 50, 51 for the generated radiation to be formed through local intermixing of the active layer 3.

This intermixing takes place as follows in this embodiment: after removal of the structure from the growing device, a masking layer 30 of silicon dioxide is provided on the structure by sputtering and photolithography, comprising strip-shaped recesses 31, 32 which are each approximately 20 μm wide and of which only half the width is visible in FIG. 3, which recesses are present at the area of an exit surface 50, 51 to be formed for the radiation generated in the diode. Subsequently, the device is introduced into a closed capsule together with zinc arsenide, and the capsule is heated to a temperature of between 550° and 650° C., preferably between approximately 600° and 650° C., in this case a temperature of 600° C. Impurities, here Zn atoms 1000, are diffused thereby into the semiconductor body 100 to beyond the active layer 3, so that the passive region 3B is formed therein through intermixing below the recesses 31, 32. If an ion implantation is used for introducing, for example, Zn ions 1000 shallowly into the semiconductor body 100, the latter is preferably completely covered with a thin layer, for example a 0.1 μm thick SiO₂ layer, before a subsequent temperature treatment.

After removal from the capsule, the mask 30 is removed and a strip-shaped mask 40 of silicon dioxide is provided (see FIG. 4). Then a mesa-shaped strip 12—perpendicular to the plane of drawing—is etched into the semiconductor layer structure, for which usual (selective) etching means are used for the layers situated above the etching stopper layer 5. After the structure has been cleaned, the blocking layer 13 is deposited on either side of the mesa 12, again by OMVPE. After removal of the silicon dioxide mask 40 and after cleaning of the structure, a second contact layer 6 is provided in a final OMVPE process. Materials, compositions, thicknesses, conductivity types, and doping concentrations are chosen for the semiconductor layers as listed in the Table above. Then conductive layers 7, 8 of the thickness and composition described above are provided, for example, by sputtering. After cleaving in two mutually perpendicular directions, separate diodes according to the invention (see FIG. 1) are obtained which are ready for final mounting.

Figure 6:
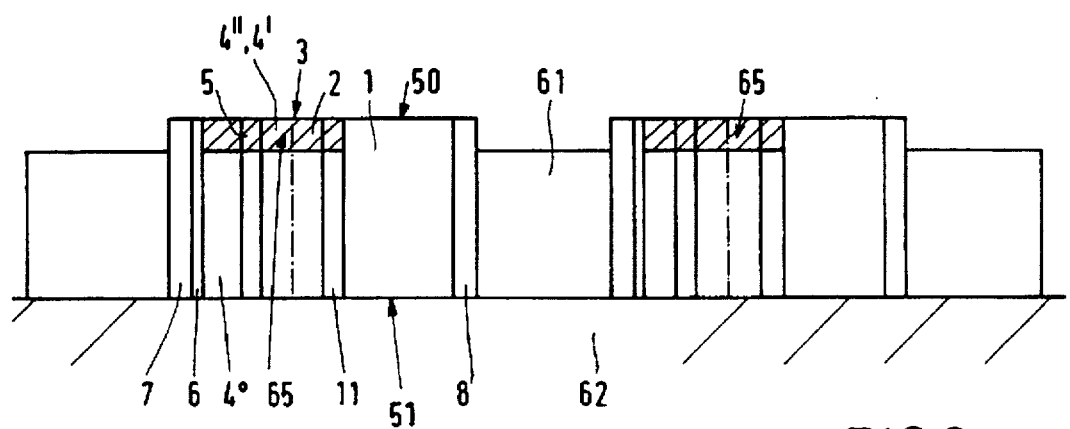
FIG. 6 is a cross-section of the diode of FIG. 1 taken on the line II—II in a stage of its manufacture by a second version of a method according to the invention.

FIG. 6 shows a cross-section of the diode of FIG. 1 taken on the line II—II in a stage of manufacture by a second embodiment of a method according to the invention. The method is largely identical to the method discussed above. First, as shown in FIG. 3 and discussed above, the semiconductor layers 11 to 10 are provided on the substrate 1. Then a strip-shaped mask 40 is provided on the structure (see FIG. 4), after which the mesa 12 is formed through etching. The semiconductor layer 13 is subsequently provided on either side of the mesa 12 by selective epitaxy.

After removal of the mask 40, the contact layer 6 is provided by non-selective epitaxy. Then the conductive layers 7, 8 are provided and the structure is cleaved into a series of semiconductor bodies which each comprise one row of diodes 100 lying next to one another. Two such semiconductor bodies are shown in FIG. 6. These semiconductor bodies are placed on a carrier 62, separated from one another by means of separation strips 61.

The carrier 62 is now brought into a closed quartz capsule (not shown in FIG. 6) together with zinc arsenide, upon which the capsule is heated to a temperature of between 450° and 500° C., preferably between 475° and 525° C., in this case 500° C. As a result, Zn atoms 1000 penetrate the semiconductor body from the gas phase through an exit surface 50 within a region 65 which comprises all semiconductor layers except the layers comprising GaAs, such as the substrate 1 and the semiconductor layers 1 and 6. According to the invention, the active layer 3 is thus intermixed within the region 65, whereby the passive region 3B is formed. The width of the region 65 and of the passive region 3B in this method according to the invention is comparatively small, i.e. approximately 5 μm or even less. Such a small width has the advantage that the radiation losses in the passive region 3B are comparatively small and is possible thanks to the fact that in this method the passive region 3B is not yet present during the formation of the exit surfaces 50, 51. In fact, the alignment of an exit surface 50, 51 with a passive region 3B (already present) requires a width of at least 20 μm, corresponding to at least 10 μm per diode. The atoms of the different elements in the active region 3A are again distributed over the sub-lattice in a disorderly manner also in this modification according to the invention, and in the same manner as in a modification discussed earlier. The semiconductor bodies are turned over on the carrier 62 and the process shown in FIG. 6 is repeated in order to form a passive region 3B also at the exit surface 51. After a final cleaving step, separate diodes according to the invention are obtained which are ready for final mounting.

The invention is not limited to the embodiments described since many modifications and variations are possible to those skilled in the art within the scope of the invention. Thus different compositions, thicknesses, and growing techniques may be chosen than those mentioned in the example. It is also possible to replace the conductivity types all (simultaneously) with their opposites. Furthermore, the exit surfaces of the diode may advantageously be provided also with a protective coating, for example, of aluminium oxide. Zn atoms may be offered not only in the form of zinc arsenide in a closed capsule, but also in the form of, for example, an organometallic compound such as DEZn (=diethyl-zinc), for example in an MOVPE growing reactor. Alternative diode structures may also be used, such as the so-called gain-guided structure.

We claim:

1. A radiation-emitting semiconductor diode, comprising:
   a semiconductor body with a semiconductor substrate of a first conductivity type,
   a first cladding layer of the first conductivity type, an active layer, and a second cladding layer of a second conductivity type opposed to the first, said layers being present on said substrate, said cladding layers including means for supplying current,
   said active layer comprising a mixed crystal of III–V semiconductor materials in which atoms of different elements may be present on a sub-lattice, said active layer including exit surfaces, passive regions adjacent the exit surfaces, and a strip-shaped active region separated by the passive regions from the exit surfaces for radiation generated in the diode, and the distribution of the atoms of different elements over the sub-lattice in the active region being disorderly, and the passive region being formed through local intermixing of the active layer.

2. A radiation-emitting semiconductor diode as claimed in claim 1, characterized in that the active layer comprises at least one quantum well layer.

3. A radiation-emitting semiconductor diode as claimed in claim 1, characterized in that the active layer comprises InGaP or InAlGaP, and the semiconductor diode comprises a semiconductor diode laser.

4. A radiation-emitting semiconductor diode as claimed in claim 1, characterized in that the active layer is under compression stress.

5. A radiation-emitting semiconductor diode as claimed in claim 3, characterized in that the active layer is under compression stress.

6. A radiation-emitting semiconductor diode as claimed in claim 2, characterized in that the active layer is under compression stress.

7. A radiation-emitting semiconductor diode as claimed in claim 2, characterized in that the active layer comprises InGaP or InAlGaP, and the semiconductor diode comprises a semiconductor diode laser.

8. A radiation-emitting semiconductor diode as claimed in claim 7, characterized in that the active layer is under compression stress.

9. A radiation-emitting semiconductor diode according to claim 1, wherein said active layer comprises a multiple quantum well layer.

* * * * *